US012660460B2

(12) United States Patent
Sun et al.

(10) Patent No.: US 12,660,460 B2
(45) Date of Patent: Jun. 16, 2026

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Kaipeng Sun, Beijing (CN); Weiyun Huang, Beijing (CN); Binyan Wang, Beijing (CN); Chao Wu, Beijing (CN); Yudiao Cheng, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 822 days.

(21) Appl. No.: 17/984,055

(22) Filed: Nov. 9, 2022

(65) Prior Publication Data

US 2023/0067919 A1 Mar. 2, 2023

Related U.S. Application Data

(63) Continuation of application No. 17/782,333, filed as application No. PCT/CN2021/094065 on May 17, 2021.

(30) Foreign Application Priority Data

Jun. 30, 2020 (CN) .......................... 202010617909.7

(51) Int. Cl.
H01L 27/32 (2006.01)
H01L 51/52 (2006.01)
(Continued)

(52) U.S. Cl.
CPC ......... *H10K 59/353* (2023.02); *H10K 59/131* (2023.02); *H10K 59/60* (2023.02); *H10K 59/65* (2023.02); *H10K 59/8792* (2023.02)

(58) Field of Classification Search
CPC ................................................. G02F 1/133512
See application file for complete search history.

(56) References Cited

U.S. PATENT DOCUMENTS 9,971,212 B2 5/2018 Hao
10,916,609 B2 2/2021 Xie
(Continued)

FOREIGN PATENT DOCUMENTS

CN 105629605 A 6/2016
CN 109541833 A 3/2019
(Continued)

OTHER PUBLICATIONS

International Search Report in PCT/CN2021/094065 in Chinese dated Sep. 1, 2021 with English translation.
(Continued)

*Primary Examiner* — Nan-Ying Yang
(74) *Attorney, Agent, or Firm* — William C. Collard

(57) ABSTRACT

Disclosed are a display substrate and a display device. The display substrate includes a base substrate, which include a first display region and a second display region, the first display region includes a plurality of sub-display regions and a sub-light-emitting region; and a plurality of sub-pixels, which include first sub-pixels, second sub-pixels and third sub-pixels, the plurality of sub-pixels include a plurality of first pixel groups, which are located in the plurality of sub-display regions, and at least one of the first pixel groups includes at least one first sub-pixel, at least one second sub-pixel, and at least one third sub-pixel; and a plurality of first light-shielding layers, located in the plurality of sub-
(Continued)

display region, an orthographic projection of the plurality of first pixel groups on the base substrate falls within an orthographic projection of the plurality of first light-shielding layers on the base substrate.

20 Claims, 5 Drawing Sheets

(51) Int. Cl.

| | |
|---|---|
| *H10K 59/131* | (2023.01) |
| *H10K 59/35* | (2023.01) |
| *H10K 59/60* | (2023.01) |
| *H10K 59/65* | (2023.01) |
| *H10K 59/80* | (2023.01) |

(56) References Cited

U.S. PATENT DOCUMENTS

| | | | |
|---|---|---|---|
| 11,263,968 B2 | 3/2022 | Wang et al. | |
| 2016/0155755 A1* | 6/2016 | Liu | H10D 86/60 |
| | | | 257/72 |
| 2019/0131378 A1 | 5/2019 | Sung et al. | |
| 2019/0326366 A1* | 10/2019 | Fan | H10K 59/353 |
| 2020/0066809 A1* | 2/2020 | Liu | H10K 59/121 |
| 2020/0073616 A1* | 3/2020 | Lius | H10K 59/65 |
| 2020/0312832 A1 | 10/2020 | Chi et al. | |

| | | | |
|---|---|---|---|
| 2020/0373372 A1* | 11/2020 | Chung | H10K 59/8792 |
| 2021/0296419 A1* | 9/2021 | Xu | H10K 59/173 |
| 2021/0359033 A1 | 11/2021 | Zhao et al. | |
| 2021/0391402 A1 | 12/2021 | Song et al. | |
| 2021/0407375 A1 | 12/2021 | Tang et al. | |
| 2022/0020953 A1 | 1/2022 | Huang et al. | |

FOREIGN PATENT DOCUMENTS

| | | |
|---|---|---|
| CN | 109599419 A | 4/2019 |
| CN | 109962092 A | 7/2019 |
| CN | 110112189 A | 8/2019 |
| CN | 110416278 A | 11/2019 |
| CN | 110444125 A | 11/2019 |
| CN | 110534541 A | 12/2019 |
| CN | 110729337 A | 1/2020 |
| CN | 110767739 A | 2/2020 |
| CN | 110914891 A | 3/2020 |
| CN | 111028765 A | 4/2020 |
| WO | 2020/029711 A1 | 2/2020 |

OTHER PUBLICATIONS

Written Opinion in PCT/CN2021/094065 dated Sep. 1, 2021 in Chinese with English translation.
Extended European Search Report In European Application No. 21832137.0 dated May 24, 2023.

* cited by examiner 142  130  120/123  141  120/121  120/122

152  151  110  152

152  142  141  123/130

123/130  121/130  122/130  151

128  128  128

172  171

300

DISPLAY SUBSTRATE AND DISPLAY DEVICE

For all purposes, this application is a continuation of U.S. Ser. No. 17/782,333 filed on Jun. 3, 2022, which is a national stage application of PCT international patent application PCT/CN2021/094065 filed on May 17, 2021, which claims priority to the Chinese patent application No. 202010617909.7, filed on Jun. 30, 2020, the entire disclosure of which is incorporated herein by reference as part of the present application.

TECHNICAL FIELD

The embodiments of the present disclosure relate to a display substrate and a display device.

BACKGROUND

With the continuous development of display technology, organic light emitting diode (OLED) display technology has been increasingly used in various electronic products because of its advantages of self-illumination, wide viewing angle, high contrast, low power consumption and high reaction speed.

On the other hand, with the continuous development of organic light emitting diode display technology, people's requirements for the screen ratio of electronic products are higher and higher. Thus, the design of placing some functional components of electronic products under the screen has become a new research hotspot. For example, the camera of electronic products can be set under the screen, that is, a under-screen camera design.

SUMMARY

The embodiments of the present disclosure provide a display substrate and a display device. The display substrate includes a base substrate including a first display region and a second display region, the second display region at least partially surrounding the first display region; and a plurality of sub-pixels located on the base substrate and in the first display region and the second display region, a density of the sub-pixels in the first display region is less than a density of the sub-pixels in the second display region, each sub-pixel includes a pixel circuit, the plurality of sub-pixels include a first sub-pixel, a second sub-pixel and a third sub-pixel, the plurality of sub-pixels include a plurality of first pixel groups and a plurality of second pixel groups, the plurality of first pixel groups are located in the first display region, the plurality of second pixel groups are located in the second display region, the first display region includes a plurality of sub-display regions and a sub-light-transmitting region between the sub-display regions, the plurality of first pixel groups are arranged in one-to-one correspondence with the plurality of sub-display regions, each of the first pixel groups includes one of the first sub-pixels, one of the second sub-pixels and one of the third sub-pixels arranged in sequence in a first direction, each of the second pixel groups includes one of the first sub-pixels, one second sub-pixel pair and one of the third sub-pixels arranged in the first direction, the second sub-pixel pair includes two of the second sub-pixels arranged in a second direction. The display substrate adopts the pixel arrangement of real GRB in the first display region and the pixel arrangement of GGRB in the second display region; on the one hand, the display substrate can reduce the resolution or PPI (Pixel Per Inch) of the first display region, thereby increasing the light transmittance of the first display region; on the other hand, the second display region of the display substrate has higher resolution and display effect. In addition, because the first display region adopts the pixel arrangement of real GRB, the green sub-pixel has a larger luminous area, thus having a longer service life.

At least one embodiment of the present disclosure provides a display substrate, which includes: a base substrate, including a first display region and a second display region, the second display region at least partially surrounding the first display region; and a plurality of sub-pixels, located on the base substrate and in the first display region and the second display region, a density of the sub-pixels in the first display region being less than a density of the sub-pixels in the second display region, each of the sub-pixels including a pixel circuit, the plurality of sub-pixels include first sub-pixels, second sub-pixels and third sub-pixels, the plurality of sub-pixels include a plurality of first pixel groups and a plurality of second pixel groups, the plurality of first pixel groups are located in the first display region, the plurality of second pixel groups are located in the second display region, the first display region includes a plurality of sub-display regions and a sub-light-transmitting region between the sub-display regions, the plurality of first pixel groups are arranged in one-to-one correspondence with the plurality of sub-display regions, each of the first pixel groups includes one first sub-pixel of the first sub-pixels, one second sub-pixel of the second sub-pixels and one third sub-pixel of the third sub-pixels arranged in sequence in a first direction, each of the second pixel groups includes one first sub-pixel of the first sub-pixels, one second sub-pixel pair and one third sub-pixel of the third sub-pixels arranged in the first direction, the second sub-pixel pair includes two second sub-pixels of the second sub-pixels arranged in a second direction.

For example, the display substrate provided by an embodiment of the present disclosure further includes: a plurality of first light-shielding layers, arranged in one-to-one correspondence with the plurality of sub-display regions, and each of the first light-shielding layers being located at a side of a corresponding one of the first pixel groups close to the base substrate; and a second light-shielding layer, located in the second display region and at a side of the plurality of second pixel groups close to the base substrate.

For example, in the display substrate provided by an embodiment of the present disclosure, each of the sub-pixels further includes a power line extending along the second direction, the power line being connected with the pixel circuit and configured to apply a constant voltage to the pixel circuit, the power line of at least one sub-pixel in each of the first pixel groups is electrically connected with a corresponding one of the first light-shielding layers, and the power line of at least one sub-pixel in each of the second pixel groups is electrically connected with the second light-shielding layer.

For example, in the display substrate provided by an embodiment of the present disclosure, the power line of the first sub-pixel in each of the first pixel groups is electrically connected with a corresponding one of the first light-shielding layers, and power lines of the first sub-pixel, the second sub-pixel and the third sub-pixel in each of the second pixel groups are electrically connected with the corresponding second light-shielding layer.

For example, in the display substrate provided by an embodiment of the present disclosure, each of the sub-display regions includes three unit regions, and the first sub-pixel, the second sub-pixel and the third sub-pixel in one of the first pixel groups are respectively arranged in the three unit regions, a first spacing region is arranged between adjacent ones of the first pixel groups in the first direction, the first spacing region includes one unit region, a second spacing region is arranged between adjacent ones of the first pixel groups in the second direction, and the second spacing region includes three unit regions arranged in the first direction, the sub-light-transmitting region includes the first spacing region and the second spacing region.

For example, in the display substrate provided by an embodiment of the present disclosure, the power line of the second sub-pixel in each of the first pixel groups passes through the second spacing region and is connected with the power line of the second sub-pixel in an adjacent first pixel group in the second direction, the power line of the first sub-pixel in each of the first pixel groups is disconnected from the power line of the first sub-pixel in an adjacent first pixel group in the second direction, the power line of the third sub-pixel in each of the first pixel groups is disconnected from the power line of the third sub-pixel in an adjacent first pixel group in the second direction.

For example, in the display substrate provided by an embodiment of the present disclosure, the pixel circuit of each of the sub-pixels in each of the first pixel groups includes a first initialization signal line, a first reset signal line, a gate line, an emission control line, a second initialization signal line and a second reset signal line extending along the first direction, in each of the first pixel groups, the first initialization signal line of the first sub-pixel, the first initialization signal line of the second sub-pixel and the first initialization signal line of the third sub-pixel are connected, in each of the first pixel groups, the first reset signal line of the first sub-pixel, the first reset signal line of the second sub-pixel and the first reset signal line of the third sub-pixel are connected, in each of the first pixel groups, the gate line of the first sub-pixel, the gate line of the second sub-pixel and the gate line of the third sub-pixel are connected, in each of the first pixel groups, the emission control line of the first sub-pixel, the emission control line of the second sub-pixel and the emission control line of the third sub-pixel are connected, in each of the first pixel groups, the second initialization signal line of the first sub-pixel, the second initialization signal line of the second sub-pixel and the second initialization signal line of the third sub-pixel are connected, in each of the first pixel groups, the second reset signal line of the first sub-pixel, the second reset signal line of the second sub-pixel and the second reset signal line of the third sub-pixel are connected.

For example, in the display substrate provided by an embodiment of the present disclosure, the power line of the first sub-pixel in each of the first pixel groups is electrically connected with a corresponding first light-shielding layer through a first light-shielding layer via hole, the power lines of the first sub-pixel, the second sub-pixel and the third sub-pixel in each of the second pixel groups are electrically connected with the second light-shielding layer through second light-shielding layer via holes, an orthographic projection of the first light-shielding layer via hole the on the base substrate is located at a side of the second reset signal line away from the emission control line.

For example, in the display substrate provided by an embodiment of the present disclosure, one of the first pixel groups includes only one first light-shielding layer via hole.

For example, in the display substrate provided by an embodiment of the present disclosure, the pixel circuit of the first sub-pixel includes: a wiring region, the first initialization signal line, the first reset signal line, the gate line, the emission control line, the second initialization signal line and the second reset signal line being arranged in the wiring region; and a via hole region, located at a side of the wiring region close to the second spacing region, the first light-shielding layer via hole is arranged in the via hole region.

For example, in the display substrate provided by an embodiment of the present disclosure, the pixel circuit of each of the sub-pixels in each of the second pixel groups includes a first initialization signal line, a first reset signal line, a gate line and an emission control line extending along the first direction, the extension lines of the second initialization signal line and the second reset signal line of the first sub-pixel in one of the first pixel groups are located between the first emission control line of the first sub-pixel in one of the second pixel groups in the same row as the one of the first pixel groups and the first reset signal line of the first sub-pixel in one of the second pixel groups in a next row.

For example, in the display substrate provided by an embodiment of the present disclosure, the first initialization signal line of the third sub-pixel in each of the first pixel groups is connected with the first initialization signal line of the first sub-pixel in an adjacent one of the first pixel groups in the first direction through a first connecting line, the first reset signal line of the third sub-pixel in each of the first pixel groups is connected with the first reset signal line of the first sub-pixel in an adjacent one of the first pixel groups in the first direction through a second connecting line, the gate line and the second reset signal line of the third sub-pixel in each of the first pixel groups are connected by a third connecting line, and are connected with the gate line and the second reset signal line of the first sub-pixel in an adjacent one of first pixel groups in the first direction through the third connecting line, the emission control line of the third sub-pixel in each of the first pixel groups is connected with the emission control line of the first sub-pixel in an adjacent one of the first pixel groups in the first direction through a fourth connecting line, the second initialization signal line of the third sub-pixel in each of the first pixel groups is connected with the second initialization signal line of the first sub-pixel in an adjacent one of the first pixel groups in the first direction through a fifth connecting line, the first connecting line, the second connecting line, the third connecting line, the fourth connecting line and the fifth connecting line gather together in the first spacing region.

For example, in the display substrate provided by an embodiment of the present disclosure, the first connecting line, the third connecting line and the fifth connecting line are arranged in the same layer as the power line, and are arranged in different layers from the first initialization signal line, the gate line and the second initialization signal line.

For example, in the display substrate provided by an embodiment of the present disclosure, the second connecting line and the first reset signal line are arranged in the same layer and integrally formed, and the fourth connecting line and the emission control line are arranged in the same layer and integrally formed.

For example, in the display substrate provided by an embodiment of the present disclosure, the first connecting line, the second connecting line, the third connecting line, the fourth connecting line and the fifth connecting line are sequentially arranged in the second direction.

For example, in the display substrate provided by an embodiment of the present disclosure, the pixel circuit further includes a data line extending along the second direction, the data line of the first sub-pixel in each of the first pixel groups is connected with the data line of the first sub-pixel in an adjacent one of the first pixel groups in the second direction through a sixth connecting line, the data line of the second sub-pixel in each of the first pixel groups is connected with the data line of the second sub-pixel in an adjacent one of the first pixel groups in the second direction through a seventh connecting line, the data line of the third sub-pixel in each of the first pixel groups is connected with the data line of the third sub-pixel in an adjacent one of the first pixel groups in the second direction through an eighth connecting line, the sixth connecting line, the seventh connecting line and the eighth connecting line gather together in the second spacing region.

For example, in the display substrate provided by an embodiment of the present disclosure, the sixth connecting line and the first initialization signal line are arranged in the same layer, and are arranged in different layers from the data line, the seventh connecting line and the data line are arranged in the same layer and integrated formed, and the eighth connecting line and the first reset signal line are arranged in the same layer, and are arranged in different layers from the data line.

For example, in the display substrate provided by an embodiment of the present disclosure, the sixth connecting line, the eighth connecting line and the seventh connecting line are sequentially arranged in the first direction.

For example, in the display substrate provided by an embodiment of the present disclosure, the sub-light-transmitting region is not provided with the sub-pixels.

For example, in the display substrate provided by an embodiment of the present disclosure, the first direction is substantially perpendicular to the second direction.

For example, in the display substrate provided by an embodiment of the present disclosure, the first sub-pixel is configured to emit light of a first color, the second sub-pixel is configured to emit light of a second color, and the third sub-pixel is configured to emit light of a third color.

For example, in the display substrate provided by an embodiment of the present disclosure, the first color is red, the second color is green and the third color is blue.

At least one embodiment of the present disclosure further provides a display device, including any one of the above-mentioned display substrate.

For example, the display device provided by an embodiment of the present disclosure further includes a photosensitive functional element, located at a side of the plurality of sub-pixels close to the base substrate, an orthographic projection of the photosensitive functional element on the base substrate at least partially overlaps with the first display region.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

6

Figures 3, 4:
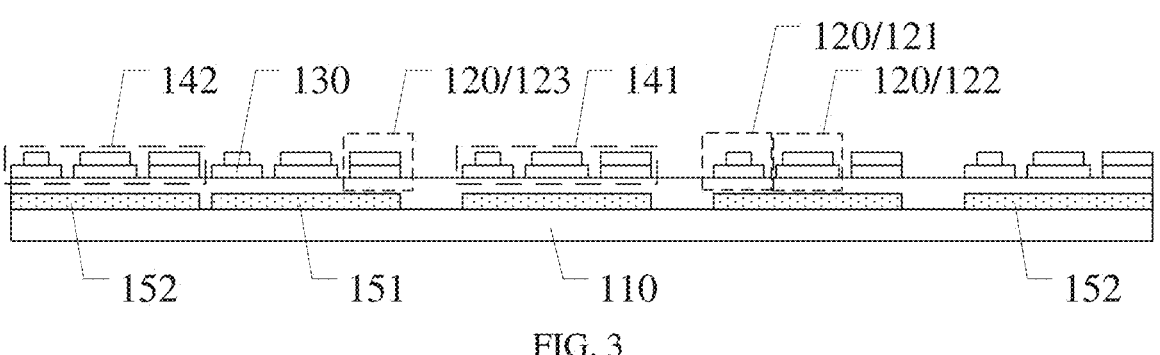
FIG. 3 is a schematic cross-sectional of a display substrate along an AA direction in FIG. 2 according to an embodiment of the present disclosure.
Figure 5:
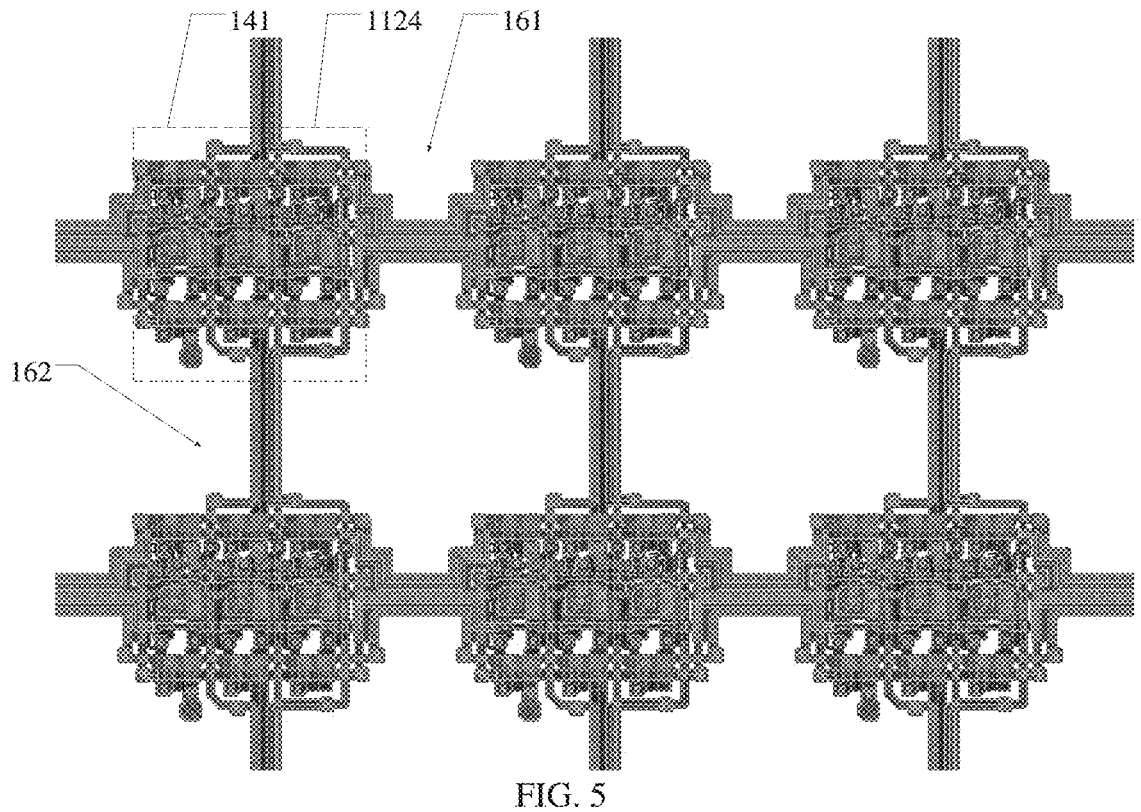
Figure 6:
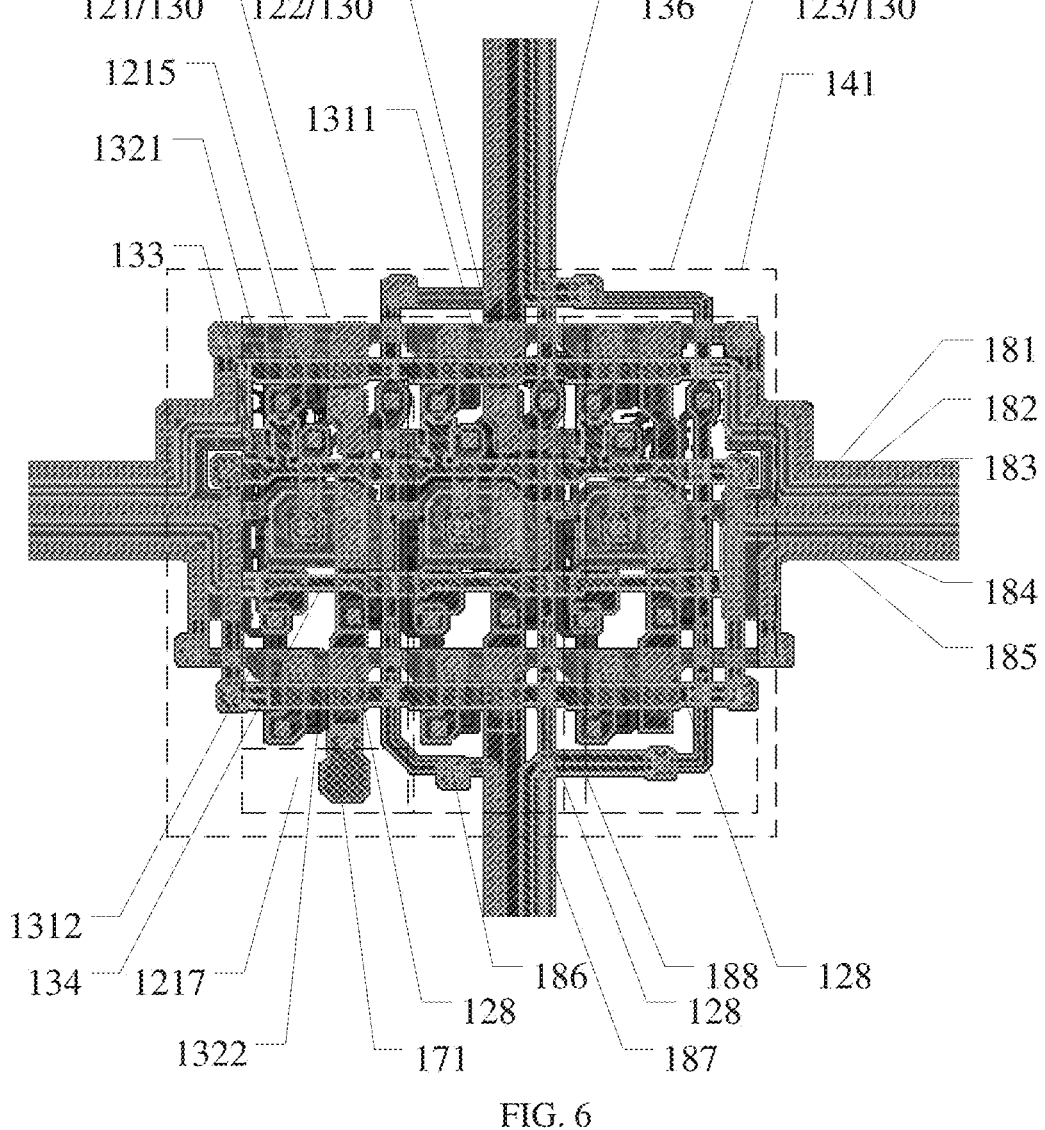

FIG. 4 is a partial plan view of another display substrate according to an embodiment of the present disclosure;

FIG. 5 is a partial plan view of a display substrate according to an embodiment of the present disclosure;

FIG. 6 is an enlarged schematic diagram of one first pixel group in FIG. 5; and

Figure 7:
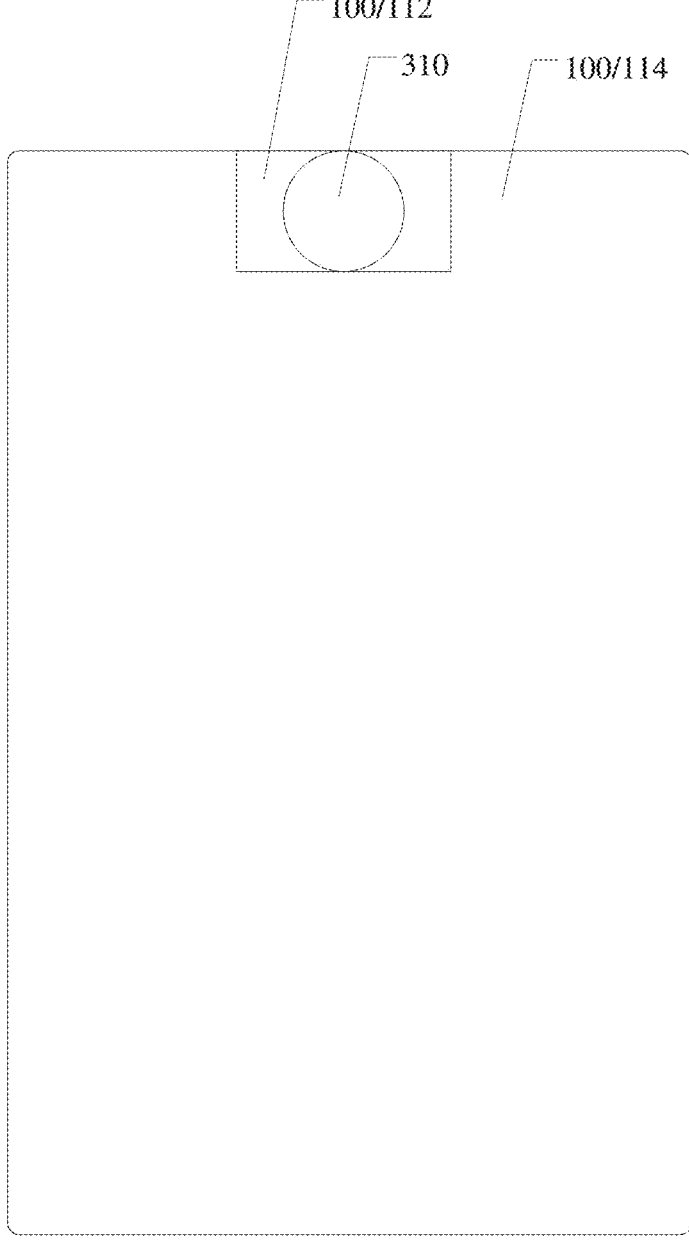

FIG. 7 is a schematic diagram of a display device according to an embodiment of the present disclosure.

DETAILED DESCRIPTION

In order to make objects, technical solutions, and advantages of the embodiments of the present disclosure apparent, the technical solutions of the embodiments of the present disclosure will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

With people's increasing requirements for the screen ratio of electronic products, the design of under-screen camera has become a research focus of major manufacturers. The main technical difficulty in the design of the under-screen camera is the low light transmittance of the screen, which seriously affects the imaging quality of the camera placed under the screen.

With the improvement of consumers' requirements for screen integrity, the under-screen camera design is becoming more and more popular. At present, in the field of OLED, the main technical difficulty of the under-screen camera design is the low screen transmittance, which seriously affects the imaging quality of the camera placed under the screen. For example, the display screen can be divided into a first display region and a second display region, the camera can be arranged in the first display region, and the second display region can be a normal display region; by reducing the resolution of the first display region, the density of sub-pixels in the first display region can be reduced, thus increasing the light transmittance, and further realizing the under-screen camera function.

The embodiments of the present disclosure also provides a display substrate and a display device. The display substrate includes a base substrate including a first display region and a second display region, the second display region at least partially surrounding the first display region; and a plurality of sub-pixels located on the base substrate and in the first display region and the second display region, a density of the sub-pixels in the first display region is less than a density of the sub-pixels in the second display region, each sub-pixel includes a pixel circuit, the plurality of sub-pixels include a first sub-pixel, a second sub-pixel and a third sub-pixel, the plurality of sub-pixels include a plurality of first pixel groups and a plurality of second pixel groups, the plurality of first pixel groups are located in the first display region, the plurality of second pixel groups are located in the second display region, the first display region includes a plurality of sub-display regions and a sub-light-transmitting region between the sub-display regions, the plurality of first pixel groups are arranged in one-to-one correspondence with the plurality of sub-display regions, each of the first pixel groups includes one of the first sub-pixels, one of the second sub-pixels and one of the third sub-pixels arranged in sequence in a first direction, each of the second pixel groups includes one of the first sub-pixels, one second sub-pixel pair and one of the third sub-pixels arranged in the first direction, the second sub-pixel pair includes two of the second sub-pixels arranged in a second direction. The display substrate adopts the pixel arrangement of real GRB in the first display region and the pixel arrangement of GGRB in the second display region; on the one hand, the display substrate can reduce the resolution or PPI (Pixel Per Inch) of the first display region, thereby increasing the light transmittance of the first display region; on the other hand, the second display region of the display substrate has higher resolution and display effect. In addition, because the first display region adopts the pixel arrangement of real GRB, the green sub-pixel has a larger luminous area, thus having a longer service life.

Hereinafter, the display substrate and display device provided by the embodiment of the present disclosure will be described in detail with reference to the accompanying drawings.

Figure 1:
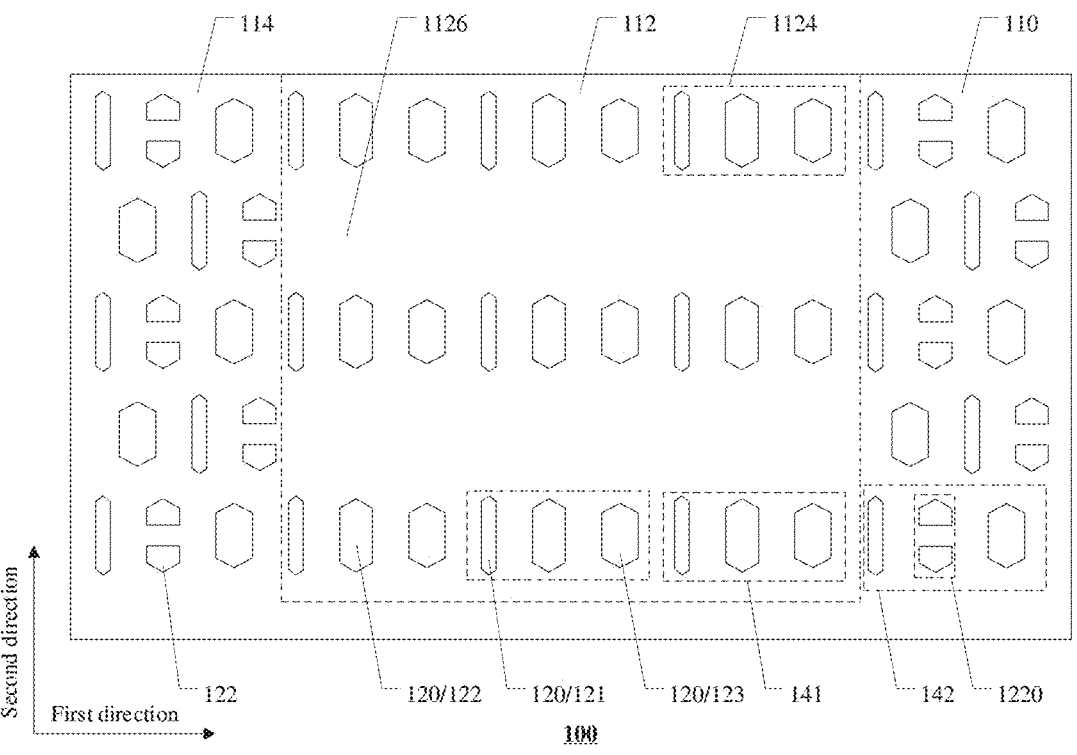
FIG. 1 is a schematic plan view of a display substrate according to an embodiment of the present disclosure.

FIG. 1 is a schematic plan view of a display substrate according to an embodiment of the present disclosure. As illustrated by FIG. 1, the display substrate 100 includes a base substrate 110 and a plurality of sub-pixels 120; the base substrate 110 includes a first display region 112 and a second display region 114, and the second display region 114 at least partially surrounds the first display region 112; a plurality of sub-pixels 120 are located on the base substrate 110, and located in the first display region 112 and the second display region 114, and a density of sub-pixels in the first display region 112 is less than a density of sub-pixels in the second display region 114; each sub-pixel 120 includes a pixel circuit. The plurality of sub-pixels 120 include first sub-pixels 121, second sub-pixels 122 and third sub-pixels 123. The plurality of sub-pixels 120 includes a plurality of first pixel groups 141 and a plurality of second pixel groups 142. The plurality of first pixel groups 141 are located in the first display region 112 and the plurality of second pixel groups 142 are located in the second display region 114. The first display region 112 includes a plurality of sub-display regions 1124 and a sub-light-transmitting region 1126 between the sub-display regions 1124. The plurality of first pixel groups 141 are arranged in one-to-one correspondence with the sub-display regions 1124. Each of the first pixel groups 141 includes one first sub-pixel 121, one second sub-pixel 122 and one third sub-pixel 123 arranged in sequence along a first direction. Each second pixel group 142 includes one first sub-pixel 121, one second sub-pixel pair 1220 and one third sub-pixel 123 arranged along the first direction, and the second sub-pixel pair 1220 includes two second sub-pixels 122 arranged along a second direction.

In the display substrate provided by the embodiment of the present disclosure, the first display region 112 includes a plurality of sub-display regions 1124 and a sub-light-transmitting region 1126 between the sub-display regions 1124, and the plurality of first pixel groups 141 are arranged in one-to-one correspondence with the sub-display regions 1124. At this time, the plurality of sub-display regions in the first display region 112 can be used for display, while the sub-light-transmitting region 1126 can allow light to pass through, so the first display region 112 can be provided with photosensitive functional elements, such as a camera. Each of the first pixel groups 141 includes one first sub-pixel 121, one second sub-pixel 122, and one third sub-pixel 123 arranged in sequence along the first direction. It can be seen that the sub-pixels in the first display region 112 can adopt the pixel arrangement of real GRB. In this case, the light emitting area of the second sub-pixel is larger, thus having a longer service life. Each second pixel group 142 includes one first sub-pixel 121, one second sub-pixel pair 1220 and one third sub-pixel 123 arranged along the first direction, and the second sub-pixel pair 1220 includes two second sub-pixels 122 arranged along the second direction. It can be seen that the sub-pixels in the second display region 114 can adopt the pixel arrangement of GGRB, thus having higher resolution and better display effect. It should be noted that, because the number of the sub-pixels in the first display region is small, in order to make the brightness of the whole display substrate uniform, the brightness of the sub-pixels in each first pixel group is greater than that of the sub-pixels in the second pixel group, the display substrate can have a longer service life by increasing the light emitting area of the second sub-pixels in the first pixel group.

For example, as illustrated by FIG. 1, an orthographic projection of the first display region 112 on the base substrate 110 has a shape of rectangular, and the second display region 114 surrounds three edges of the first display region 112. Of course, embodiments of the present disclosure include but are not limited thereto. The orthographic projection of the first display region 112 on the base substrate 110 can also have other shapes, such as circular or drop shape. In addition, the second display region 114 may also surround all edges of the first display region 112.

In some examples, the sub-light-transmitting region 1126 is not provided with the sub-pixel 120. Therefore, the sub-light-transmitting region 1126 can have higher light transmittance.

In some examples, the first direction is substantially perpendicular to the second direction. It should be noted that the above-mentioned situation that the first direction is substantially perpendicular to the second direction includes the case that the included angle between the first direction and the second direction is 90 degrees and the case that the included angle between the first direction and the second direction is 80-100 degrees.

In some examples, the first sub-pixel 121 is configured to emit light of a first color, the second sub-pixel 122 is configured to emit light of a second color, and the third sub-pixel 123 is configured to emit light of a third color.

For example, the first color is red, the second color is green and the third color is blue.

Figure 2:
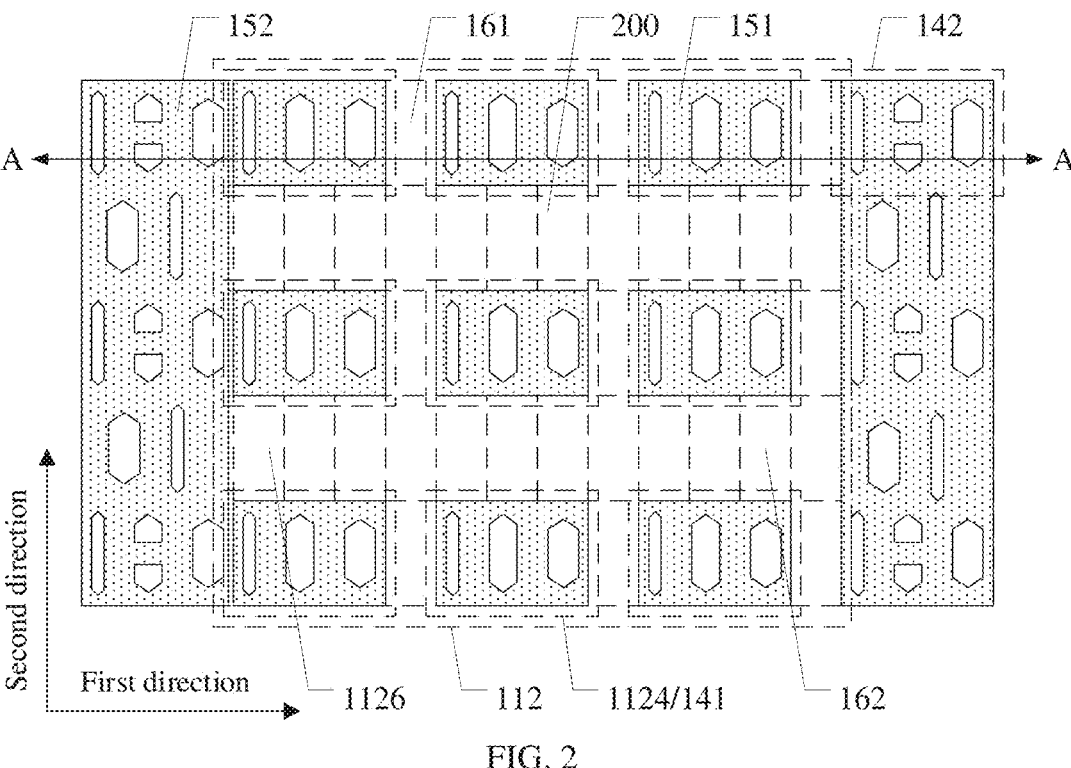
FIG. 2 is a schematic plan view of another display substrate according to an embodiment of the present disclosure.

FIG. 2 is a schematic plan view of another display substrate according to an embodiment of the present disclosure; FIG. 3 is a schematic cross-sectional view of a display substrate along the AA direction in FIG. 2 according to an embodiment of the present disclosure.

As illustrated by FIG. 2 and FIG. 3, the display substrate 100 further includes a plurality of first light-shielding layers 151 and a second light-shielding layer 152; the plurality of first light-shielding layers 151 and the plurality of sub-display regions 1124 are arranged in one-to-one correspondence; each first light-shielding layer 151 is located at a side of the corresponding first pixel group 141 close to the base substrate 110; the second light-shielding layer 152 is located in the second display region 114, and at a side of the second pixel groups 142 close to the base substrate 110. Therefore, the first light-shielding layer 151 can prevent the light emitted by the first pixel group 141 from entering the photosensitive functional elements arranged in the first display region 112; similarly, the second light-shielding layer 152 can also prevent the light emitted by the second pixel group 142 from entering the photosensitive functional element arranged in the first display region 112, thus ensuring that the photosensitive functional element can realize its function with high quality. For example, the photosensitive functional element can be a camera.

For example, orthographic projections of the pixel circuits 130 of the plurality of sub-pixels 120 in the first pixel group 141 on the base substrate 110 fall within orthographic projections of the corresponding first light-shielding layers 151 on the base substrate 110, so that the first light-shielding layer 151 can shield the pixel circuits 130 of the plurality of sub-pixels 120 in the first pixel group 141, and prevent light from entering the photosensitive functional element through slits between the signal lines of the pixel circuits 130.

For example, as illustrated by FIG. 2 and FIG. 3, adjacent sub-display regions 1124 are arranged at an interval. Of course, embodiments of the present disclosure include, but are not limited to, two adjacent sub-display regions or more sub-display regions can be closely arranged to form a larger region.

In some examples, as illustrated by FIG. 2 and FIG. 3, the second light-shielding layer 151 can occupy the entire area of the second display region 114, while the first light-shielding layers 151 only occupy the area of the sub-display regions 1124 in the first display region 112, thus ensuring that the first display region 112 has certain light transmittance.

In some examples, as illustrated by FIG. 2, each sub-display region 1124 includes three unit regions 200 in which the first sub-pixel 121, the second sub-pixel 122 and the third sub-pixel 123 in the first pixel group 141 are respectively arranged. That is, one unit region 200 is provided with one sub-pixel 120. A first spacing region 161 is arranged between the first pixel groups 141 adjacent in the first direction, the first spacing region 161 includes one unit region 200, and a second spacing region 162 is arranged between the first pixel groups 141 adjacent in the second direction, the second spacing region 162 includes three unit regions 200 arranged in the first direction, and the sub-light-transmitting region 1126 includes the first spacing region 161 and the second spacing region 162. In the display substrate provided by the example, the pixel per inch of the first display region is approximately ⅜ of the pixel per inch of the second display region, and the PPI of the first display region is approximately ½ of the PPI of the second display region. Therefore, the first display region has higher light transmittance, so that the photosensitive functional elements arranged in the first display region can have better performance.

FIG. 4 is a partial plan view of another display substrate according to an embodiment of the present disclosure. FIG. 4 shows only power lines and pixel circuits of the first pixel group and the second pixel group. As illustrated by FIG. 4, each sub-pixel 120 further includes a power line 128 extending along the second direction. The power line 128 is connected with the pixel circuit 130 and configured to apply a constant voltage to the pixel circuit 130. The power line 128 of at least one sub-pixel 120 in each of the first pixel groups 141 is electrically connected with the corresponding first light-shielding layer 151, and the power line 128 of at least one sub-pixel 128 in each second pixel group 142 is electrically connected with the second light-shielding layer 152. In the display substrate provided by this example, both the first light-shielding layer and the second light-shielding layer are connected with the power line, which can prevent the first light-shielding layer and the second light-shielding layer from floating during display, thus improving the display quality of the display substrate.

In some examples, as illustrated by FIG. 4, in order to reduce the area of each of the first pixel groups 141, the power line 128 of the first sub-pixel 121 in each of the first pixel groups 141 is connected with the corresponding first light-shielding layer 151, while the power line 128 of the second sub-pixel 122 and the power line 128 of the third sub-pixel 123 in each of the first pixel groups 141 are not connected with the corresponding first light-shielding layers 151. Therefore, only the power line 128 of the first sub-pixel 121 in each of the first pixel groups 141 applies a constant voltage to the first light-shielding layer 151 corresponding to the first pixel group 141.

In some examples, as illustrated by FIG. 4, the power lines 128 of the first sub-pixel 121, the second sub-pixel 122 and the third sub-pixel 123 in each second pixel group 142 are electrically connected with the corresponding second light-shielding layer 152. Of course, the embodiments of the present disclosure include but are not limited thereto, and only the power lines of some sub-pixels in each second pixel group can be connected with the corresponding second light-shielding layer.

FIG. 5 is a partial plan view of a display substrate according to an embodiment of the present disclosure; FIG. 6 is an enlarged schematic diagram of one first pixel group in FIG. 5. As illustrated by FIG. 5 and FIG. 6, the power line 128 of the second sub-pixel 122 in each of the first pixel groups 141 is connected with the power line 128 of the second sub-pixel 122 in the first pixel group 141 adjacent to each other in the second direction through the second spacing region 162. The power lines 128 of the first sub-pixel 121 and the third sub-pixel 123 in each of the first pixel groups 141 are disconnected from the power lines 128 of the first sub-pixel 121 and the third sub-pixel 123 in the first pixel group 141 adjacent to each other in the second direction. That is, the power line 128 of the first sub-pixel 121 in each of the first pixel groups 141 is not connected with the power line 128 of the first sub-pixel 121 in the first pixel group 141 adjacent in the second direction, and the power line 128 of the third sub-pixel 123 in each of the first pixel groups 141 is not connected with the power line 128 of the third sub-pixel 123 in the first pixel group 141 adjacent in the second direction. Therefore, the display substrate can reduce the number of traces in the second spacing region, thereby improving the light transmittance of the second spacing region.

It should be noted that, as illustrated by FIG. 5 and FIG. 6, the power line 128 of the first sub-pixel 121, the power line 128 of the second sub-pixel 122 and the power line 128 of the third sub-pixel 123 in each of the first pixel groups 141 can be electrically connected with each other through a second gate layer in the pixel circuit.

In some examples, as illustrated by FIG. 5 and FIG. 6, the pixel circuit 130 of the sub-pixel 120 in each of the first pixel groups 141 includes a first initialization signal line 1311, a first reset signal line 1321, a gate line 133, an emission control line 134, a second initialization signal line 1312 and a second reset signal line 1322 extending in the first direction. In each of the first pixel groups 141, the first initialization signal line 1311 of the first sub-pixel 121, the first initialization signal line 1311 of the second sub-pixel 122 and the first initialization signal line 1311 of the third sub-pixel 123 are connected; in each of the first pixel groups 141, the first reset signal line 1321 of the first sub-pixel 121, the first reset signal line 1321 of the second sub-pixel 122 and the first reset signal line 1321 of the third sub-pixel 123 are connected; in each of the first pixel groups 141, the gate line 133 of the first sub-pixel 121, the gate line 133 of the second sub-pixel 122 and the gate line 133 of the third sub-pixel 123 are connected; in each of the first pixel groups 141, the emission control line 134 of the first sub-pixel 121, the emission control line 134 of the second sub-pixel 122 and the emission control line 134 of the third sub-pixel 123 are connected; in each of the first pixel groups 141, the second initialization signal line 1312 of the first sub-pixel 121, the second initialization signal line 1312 of the second sub-pixel 122 and the second initialization signal line 1312 of the third sub-pixel 123 are connected; in each of the first pixel groups 141, the second reset signal line 1322 of the first sub-pixel 121, the second reset signal line 1322 of the second sub-pixel 122 and the second reset signal line 1322 of the third sub-pixel 123 are connected.

It should be noted that in this disclosure, in order to more clearly explain the connection relationship of these signal lines, they are divided into signal line segments corresponding to respective sub-pixels. However, respective signal lines in each of the first pixel groups may be integrally formed. For example, as illustrated by FIG. 5, in each of the first pixel groups 141, the first initialization signal line 1311 of the first sub-pixel 121, the first initialization signal line 1311 of the second sub-pixel 122 and the first initialization signal line 1311 of the third sub-pixel 123 are integrally formed; the first reset signal line 1321 of the first sub-pixel 121, the first reset signal line 1321 of the second sub-pixel 122 and the first reset signal line 1321 of the third sub-pixel 123 are integrally formed; the gate line 133 of the first sub-pixel 121, the gate line 133 of the second sub-pixel 122 and the gate line 133 of the third sub-pixel 123 are integrally formed; the emission control line 134 of the first sub-pixel 121, the emission control line 134 of the second sub-pixel 122 and the emission control line 134 of the third sub-pixel 123 are integrally formed; the second initialization signal line 1312 of the first sub-pixel 121, the second initialization signal line 1312 of the second sub-pixel 122 and the second initialization signal line 1312 of the third sub-pixel 123 are integrally formed; the second reset signal line 1322 of the first sub-pixel 121, the second reset signal line 1322 of the second sub-pixel 122 and the second reset signal line 1322 of the third sub-pixel 123 are integrally formed.

In some examples, as illustrated by FIG. 4, FIG. 5 and FIG. 6, the power lines 128 of the first sub-pixels 121 in each of the first pixel groups 141 are electrically connected with the corresponding first light-shielding layers 151 through the first light-shielding layer via holes 171. For example, as illustrated by FIG. 4, FIG. 5 and FIG. 6, one first pixel group 141 only includes one first light-shielding layer via hole 171. The power lines 128 of the first sub-pixel 121, the second sub-pixel 122 and the third sub-pixel 123 in each second pixel group 142 are electrically connected with the second light-shielding layer 152 through the second light-shielding layer via holes 172, respectively. An orthographic projection of the first light-shielding layer via hole 171 on the base substrate 110 is located at a side of the second reset signal line 1322 away from the emission control line 134. Therefore, the second initialization signal line 1312 and the second reset signal line 1322 can be arranged closer to the emission control line 134, thereby reducing the area occupied by the pixel circuit, further reducing the area of the first light-shielding layer and improving the light transmittance of the first display region. In some examples, as illustrated by FIG. 5 and FIG. 6, the pixel circuit 130 of the first sub-pixel 121 includes a wiring region 1215 and a via hole region 1217; the first initialization signal line 1311, the first reset signal line 1321, the gate line 133, the emission control line 134, the second initialization signal line 1312 and the second reset signal line 1322 are disposed in the wiring region 1215; the via hole region 1217 is located on a side of the wiring region 1215 close to the second spacing region 162, and the first light-shielding layer via 171 is disposed in the via hole region 1217. Therefore, because of the first light-shielding layer via hole 171 is arranged in the via hole region 1217, the first initialization signal line 1311, the first reset signal line 1321, the gate line 133, the emission control line 134, the second initialization signal line 1312 and the second reset signal line 1322 can be more densely arranged in the wiring region 1215. Thus, the display substrate can reduce the area occupied by the pixel circuit, further reduce the area of the first light-shielding layer and improve the light transmittance of the first display region.

In some examples, as illustrated by FIG. 5 and FIG. 6, the pixel circuit 130 of the sub-pixel 120 in each second pixel group 142 includes a first initialization signal line 1311, a first reset signal line 1321, a gate line 133 and an emission control line 134 extending in the first direction. Extension lines of the second initialization signal line 1312 and the second reset signal line 1322 of the first sub-pixel 121 in the first pixel group 141 are located between the first emission control line 134 of the first sub-pixel 121 in the second pixel group 142 in the same row and the first reset signal line 1311 of the first sub-pixel 121 in the second pixel group 142 in the next row. In the display substrate, the pixel circuits of the sub-pixels in each second pixel group do not need to provide second initialization signal lines and second reset signal lines, but the first initialization signal lines and first reset signal lines of the sub-pixels of the second pixel group in the next row are used as the second initialization signal lines and second reset signal lines of the sub-pixels of the second pixel group in the previous row; at this time, because of the extension lines of the second initialization signal line and the second reset signal line of the first sub-pixel in the first pixel group are located between the first emission control line of the first sub-pixel in the second pixel group in the same row and the first reset signal line of the first sub-pixel in the second pixel group in the next row, the display substrate can reduce the area occupied by pixel circuits of each sub-pixel in the first pixel group, thereby reducing the area of the first light-shielding layer and improving the light transmittance of the first display region.

In some examples, as illustrated by FIG. 5 and FIG. 6, the first initialization signal line 1311 of the third sub-pixel 123 in each of the first pixel groups 141 is connected with the first initialization signal line 1311 of the first sub-pixel 121 in the first pixel group 141 adjacent in the first direction through the first connecting line 181; the first reset signal line 1321 of the third sub-pixel 123 in each of the first pixel groups 141 is connected with the first reset signal line 1321 of the first sub-pixel 121 in the first pixel group 141 adjacent in the first direction through the second connecting line 182; the gate line 133 and the second reset signal line 1322 of the third sub-pixel 123 in each of the first pixel groups 141 are connected with the gate line 133 and the second reset signal line 1322 of the first sub-pixel 121 in the first pixel group

141 adjacent in the first direction through the third connecting line 183; the emission control line 124 of the third sub-pixel 123 in each of the first pixel groups 141 is connected with the emission control line 124 of the first sub-pixel 121 in the first pixel group 141 adjacent in the first direction through the fourth connecting line 184; the second initialization signal line 1312 of the third sub-pixel 123 in each of the first pixel groups 141 is connected with the second initialization signal line 1312 of the first sub-pixel 121 in the first pixel group 141 adjacent in the first direction through the fifth connecting line 185, and the first connecting line 181, the second connecting line 182, the third connecting line 183, the fourth connecting line 184 and the fifth connecting line 185 gather together in the first spacing region 161. For example, "gather together" in the present disclosure refers to that the arrangement density of the connecting lines is less than that of various signal lines connected with the connecting lines. For example, the first connecting line to fifth connecting line 181-185 are densely arranged in the second direction, while the various signal lines to which they are connected are more sparsely arranged in the second direction. Therefore, the first connecting line, the second connecting line, the third connecting line, the fourth connecting line and the fifth connecting line are gathered in the first spacing regions, so that the display substrate can reduce the area occupied by the first connecting line, the second connecting line, the third connecting line, the fourth connecting line and the fifth connecting line in the first spacing region, thereby improving the light transmittance of the first display region.

In some examples, as illustrated by FIG. 5 and FIG. 6, the first connecting line 181, the third connecting line 183 and the fifth connecting line 185 are arranged in the same layer as the power line 128, and are arranged in different layers from the first initialization signal line 1311, the gate line 133 and the second initialization signal line 1312. For example, the first connecting line 181, the third connecting line 183 and the fifth connecting line 185 can be electrically connected with the first initialization signal line 1311, the gate line 133 and the second initialization signal line 1312 through via holes, respectively.

In some examples, as illustrated by FIG. 5 and FIG. 6, the second connecting line 182 and the first reset signal line 1321 are arranged in the same layer and integrally formed, while the fourth connecting line 184 and the emission control line 134 are arranged in the same layer and integrally formed. Thus, the first connecting line, the third connecting line and the fifth connecting line are located in the same layer, and the second connecting line and the fourth connecting line are located in the same layer; the first connecting line, the third connecting line and the fifth connecting line are located in different film layers from the second connecting line and the fourth connecting line, so on the premise of ensuring mutual insulation, the first connecting line, the second connecting line, the third connecting line, the fourth connecting line and the fifth connecting line can be closely arranged, thereby further reducing the area occupied by the first connecting line, the second connecting line, the third connecting line, the fourth connecting line and the fifth connecting line.

In some examples, as illustrated by FIG. 5 and FIG. 6, the first connecting line 181, the second connecting line 182, the third connecting line 183, the fourth connecting line 184 and the fifth connecting line 185 are sequentially arranged in the second direction. Therefore, on the premise of mutual insulation, the first connecting line, the second connecting line, the third connecting line, the fourth connecting line and the fifth connecting line can be closely arranged, so that the areas occupied by the first connecting line, the second connecting line, the third connecting line, the fourth connecting line and the fifth connecting line can be further reduced.

In some examples, as illustrated by FIG. 5 and FIG. 6, the pixel circuit 130 further includes a data line 136 extending in the second direction; the data line 136 of the first sub-pixel 121 in each of the first pixel groups 141 is connected with the data line 136 of the first sub-pixel 121 in the first pixel group 141 adjacent in the second direction through the sixth connecting line 186, and the data line 136 of the second sub-pixel 122 in each of the first pixel groups 141 is connected with the data line 136 of the second sub-pixel 122 adjacent in the second direction through the seventh connecting line 187; the data line 136 of the third sub-pixel 123 in each of the first pixel groups 141 is connected with the data line 136 of the third sub-pixel 123 in the first pixel group 141 adjacent in the second direction through the eighth connecting line 188, and the sixth connecting line 186, the seventh connecting line 187 and the eighth connecting line 188 gather together in the second spacing region 162. Therefore, the display substrate can reduce the areas occupied by the sixth connecting line, the seventh connecting line and the eighth connecting line by gathering the sixth connecting line, the seventh connecting line and the eighth connecting line in the second spacing region, thereby improving the light transmittance of the first display region.

In some examples, as illustrated by FIG. 5 and FIG. 6, the sixth connecting line 186 and the first initialization signal line 1311 are arranged in the same layer and arranged in different layers from the data line 136, the seventh connecting line 187 and the data line 136 are arranged in the same layer and integrated formed, and the eighth connecting line 188 and the first reset signal line 1321 are arranged in the same layer and arranged in different layers from the data line 136. For example, the sixth connecting line 186 and the eighth connecting line 188 can be electrically connected with the corresponding data lines 136 through via holes. Therefore, the sixth connecting line and the eighth connecting line are arranged in different layers from the data line, and the seventh connecting line and the data line are located in the same layer; That is to say, the film layers where the sixth connecting line and the eighth connecting line are located are different from the film layer where the seventh connecting line is located. Therefore, on the premise of ensuring mutual insulation, the sixth connecting line, the seventh connecting line and the eighth connecting line can be closely arranged, thereby further reducing the area occupied by the sixth connecting line, the seventh connecting line and the eighth connecting line.

In some examples, as illustrated by FIG. 6, the sixth connecting line 186, the eighth connecting line 188 and the seventh connecting line 187 are sequentially arranged in the first direction.

It should be noted that the number of the first pixel groups in the first display region in the display substrate provided by the embodiment of the present disclosure is not limited to the specific number of the first pixel groups in the first display region in the above drawings, but is set according to the specific size of the product.

An embodiment of the present disclosure also provides a display device. FIG. 7 is a schematic diagram of a display device according to an embodiment of the present disclosure. As illustrated by FIG. 7, the display device 300 includes the display substrate 100 described above. Therefore, the display device has technical effects corresponding to the beneficial technical effects of the display substrate, for details, please refer to the related description of the display substrate.

For example, the display device can be display devices such as Organic Light-Emitting Diode (OLED) displays, and any products or components with display functions such as televisions, digital cameras, mobile phones, watches, tablet computers, notebook computers, navigators, etc.

In some examples, as illustrated by FIG. 7, the display device 300 further includes a photosensitive functional element 310, which is located at a side of the plurality of sub-pixels 120 close to the base substrate 110, and an orthogonal projection of the photosensitive functional element 310 on the base substrate 110 at least partially overlaps with the first display region 112. The photosensitive functional element 310 is configured to receive light from the side of the display substrate where the plurality of sub-pixels are located, thereby realizing various functions.

For example, the above-mentioned photosensitive functional element 310 can be a camera, so that the display device can realize functions such as camera shooting while realizing a full-screen design.

The following points need to be explained:

(1) In the drawings of the embodiments of the present disclosure, only the structures related to the embodiments of the present disclosure are involved, and other structures can refer to the general design.

(2) The features of the same embodiment and different embodiments of the present disclosure can be combined with each other without conflict.

The above are only the specific embodiments of this disclosure, but the scope of protection of the present disclosure is not limited thereto. Therefore, the scope of protection of the present disclosure should be based on the scope of protection of the claims.

What is claimed is:

1. A display substrate, comprising:

a base substrate, comprising a first display region and a second display region, the second display region at least partially surrounding the first display region, the first display region comprises a plurality of sub-display regions and a sub-light-transmitting region among the plurality of sub-display regions; and a plurality of sub-pixels, located on the base substrate and in the first display region and the second display region, the plurality of sub-pixels comprise first sub-pixels, second sub-pixels and third sub-pixels, the plurality of sub-pixels comprise a plurality of first pixel groups, the plurality of first pixel groups are located in the plurality of sub-display regions, and at least one first pixel group of the plurality of first pixel groups comprises at least one first sub-pixel, at least one second sub-pixel, and at least one third sub-pixel which are arranged along a first direction; and a plurality of first light-shielding layers, located in the plurality of sub-display region, an orthographic projection of the plurality of first pixel groups on the base substrate falls within an orthographic projection of the plurality of first light-shielding layers on the base substrate.

2. The display substrate according to claim 1, wherein a first spacing region is arranged between adjacent ones of the plurality of first pixel groups in the first direction, and a second spacing region is arranged between adjacent ones of the plurality of first pixel groups in the second direction, and the sub-light-transmitting region comprises the first spacing region and the second spacing region, and the second direction intersects with the first direction.

3. The display substrate according to claim 1, wherein the sub-pixel comprises a pixel circuit, the pixel circuit comprises a first reset signal line, a gate line, an emission control line and a second reset signal line extending in the first direction, and the first pixel group satisfies at least one of the following:

the first reset signal line of the first sub-pixel, the first reset signal line of the second sub-pixel and the first reset signal line of the third sub-pixel are connected;

the gate line of the first sub-pixel, the gate line of the second sub-pixel and the gate line of the third sub-pixel are connected;

the emission control line of the first sub-pixel, the emission control line of the second sub-pixel and the emission control line of the third sub-pixel are connected; and the second reset signal line of the first sub-pixel, the second reset signal line of the second sub-pixel and the second reset signal line of the third sub-pixel are connected.

4. The display substrate according to claim 3, wherein the sub-pixel further comprises a power line extending in a second direction, the power line being connected with the pixel circuit and configured to apply a constant voltage to the pixel circuit, the first direction intersects the second direction, the power line of at least one sub-pixel in the first pixel group is connected with the power line of at least one sub-pixel in the first pixel group adjacent in the second direction.

5. The display substrate according to claim 4, wherein the first reset signal line of the third sub-pixel in the first pixel group is connected with the first reset signal line of the first sub-pixel in the first pixel group adjacent in the first direction through a second connecting line; or the gate line and the second reset signal line of the third sub-pixel in the first pixel group are connected by a third connecting line, and connected with the gate line and the second reset signal line of the first sub-pixel in the first pixel group adjacent in the first direction by the third connecting line; or the emission control line of the third sub-pixel in the first pixel group is connected with the emission control line of the first sub-pixel in the first pixel group adjacent in the first direction through a fourth connecting line.

6. The display substrate according to claim 4, wherein the first reset signal line of the third sub-pixel in the first pixel group is connected with the first reset signal line of the first sub-pixel in the first pixel group adjacent in the first direction through a second connecting line;

the gate line and the second reset signal line of the third sub-pixel in the first pixel group are connected by a third connecting line, and connected with the gate line and the second reset signal line of the first sub-pixel in the first pixel group adjacent in the first direction by the third connecting line;

the emission control line of the third sub-pixel in the first pixel group is connected with the emission control line of the first sub-pixel in the first pixel group adjacent in the first direction through a fourth connecting line;

the second connecting line, the third connecting line and the fourth connecting line gather together in the first direction.

7. The display substrate according to claim 6, wherein the second connecting line, the third connecting line and the fourth connecting line are sequentially arranged in the second direction.

8. The display substrate according to claim 4, wherein the plurality of sub-pixels further comprise a plurality of second pixel groups located in the second display region;

the display substrate further comprises a second light-shielding layer located in the second display region, the second light-shielding layer is located at a side of the plurality of second pixel groups close to the base substrate, and the power line in the second pixel group is electrically connected with the second light-shielding layer.

9. The display substrate according to claim 4, wherein the pixel circuit further comprises a data line extending in the second direction, the data line of the first sub-pixel in the first pixel group is connected with the data line of the first sub-pixel in the first pixel group adjacent in the second direction through a sixth connecting line, the data line of the second sub-pixel in the first pixel group is connected with the data line of the second sub-pixel in the first pixel group adjacent in the second direction through a seventh connecting line;

the data line of the third sub-pixel in the first pixel group is connected with the data line of the third sub-pixel in the first pixel group adjacent in the second direction through an eighth connecting line;

the sixth connecting line, the seventh connecting line and the eighth connecting line gather together in the second direction.

10. The display substrate according to claim 9, wherein the sixth connecting line and the data line are arranged in different layers, and the eighth connecting line and the data line are arranged in different layers.

11. The display substrate according to claim 4, wherein the power line of the first sub-pixel in each of the first pixel groups is electrically connected with a corresponding first light-shielding layer through a first light-shielding layer via hole, an orthographic projection of the first light-shielding layer via hole on the base substrate is located at a side of the second reset signal line away from the emission signal line.

12. The display substrate according to claim 11, wherein one of the first pixel groups comprises only one first light-shielding layer via hole.

13. The display substrate according to claim 11, wherein the pixel circuit further comprises a first initialization signal line and a second initialization signal line extending in the first direction, and the pixel circuit of the first sub-pixel comprises:

a wiring region, in which the first initialization signal line, the first reset signal line, the gate line, the emission control line, the second initialization signal line and the second reset signal line are arranged; and a via hole region, located at a side of the wiring region close to the second spacing region, and the first light-shielding layer via hole is arranged in the via hole region.

14. The display substrate according to claim 1, wherein no sub-pixel is provided in the sub-light-transmitting region.

15. The display substrate according to claim 4, wherein the first direction and the second direction are perpendicular to each other.

16. The display substrate according to claim 1, wherein the first sub-pixel is configured to emit light of a first color, the second sub-pixel is configured to emit light of a second color, and the third sub-pixel is configured to emit light of a third color.

17. The display substrate according to claim 16, wherein the first color is red, the second color is green, and the third color is blue.

18. The display substrate according to claim 1, wherein the plurality of first light-shielding layers are arranged in one-to-one correspondence with the plurality of sub-display regions, and each first light-shielding layer is located at a side of the corresponding first pixel group close to the base substrate.

19. A display device, comprising the display substrate according to claim 1.

20. The display device according to claim 19, further comprising:

a photosensitive functional element, located at a side of the plurality of sub-pixels close to the base substrate, wherein an orthographic projection of the photosensitive functional element on the substrate at least partially overlaps with the first display region.

* * * * *